2,876,354

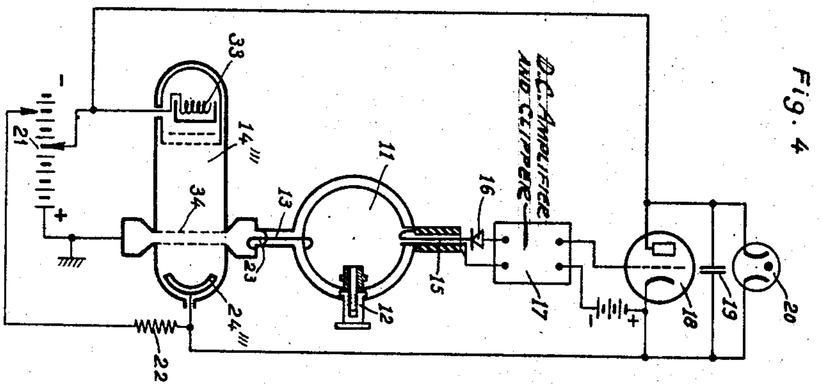
D.C. AMPLIFIER AND CLIPPER
11
12
13
14'''
15
16
17
18
19
20
21
22
23
24'''
33
34
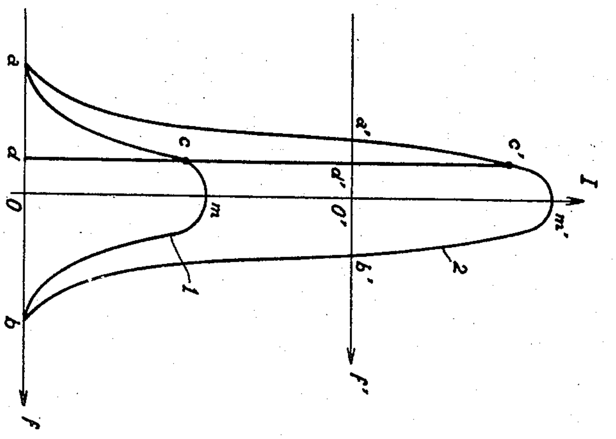
I
f
f'
1
2
m
m'
0
0'

FREQUENCY STABILIZED OSCILLATOR

Bernard Epsztein, Paris, France, assignor to Compagnie Generale de Telegraphie Sans Fil, a corporation of France Application March 31, 1955, Serial No. 498,388

Claims priority, application France April 6, 1954

7 Claims. (Cl. 250—36)

The present invention relates to systems for the control and stabilization of electronically tuned oscillator tubes.

It is known that various oscillator tubes can be electronically tuned over a wide frequency band. But, in such tubes, when the tuning range is wide, frequency stability is not entirely satisfactory, the slightest voltage variation often causing a substantial frequency drift.

Further, a stabilized source of voltage, to which one would naturally have recourse, cannot remove instabilities arising from causes other than voltage variations, and closely connected with the internal mechanism of the tube.

In brief, the circuit arrangement according to the invention comprises a cavity resonator whose resonance frequency is slightly different from the desired operating frequency of the tube, and which is coupled to the output of the latter, and means for connecting a frequency control electrode of the tube to a tapping on a voltage divider connected in shunt across the power supply of the tube, this voltage divider comprising a fixed resistance connected between this tapping and one terminal of the supply source, and a variable resistance whose value is controlled by the output of the resonator, said value being a function of the difference between the resonant frequency of the resonator and the oscillation frequency of the tube, this variable resistance being connected between said tapping and the other terminal of the supply source.

According to one feature of the invention, the variable resistance is the internal resistance of an electronic tube.

According to another feature of the invention, the variable resistance is shunted by a condenser of suitable value.

The invention will be better understood by means of the following description, with reference to the attached drawings.

Fig. 4 is a simplified diagram for the application of the invention to a reflex klystron; and Fig. 5 is an explanatory curve.

Figure 1:
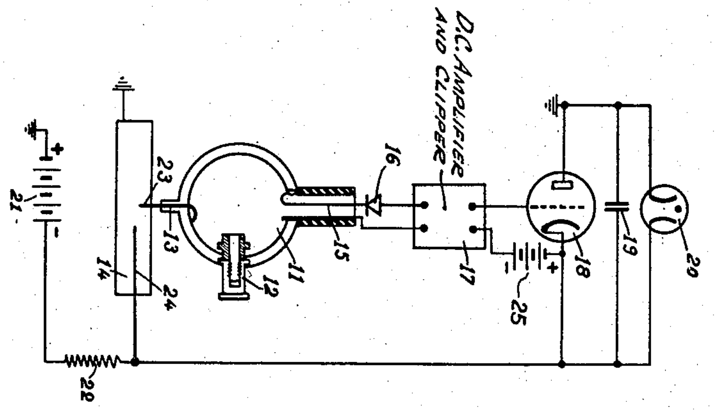
Fig. 1 shows a circuit arrangement in accordance with the invention.

In the arrangement shown in Fig. 1, a cavity resonator 11 with an input 13 and an output 15 is mechanically tunable by means of a screw 12 which penetrates more or less deeply into the resonator.

This resonator is coupled, at its input 13, to the ultra-high frequency output 23 of an electronically tuned oscillator tube 14 shown very schematically. The output terminal 15 of resonator 11 is coupled to the input of a direct current amplifier 17 through a detector 16. The two output terminals of amplifier 17 are respectively connected to the grid and to the cathode of a triode 18. The anode-cathode space of this triode is connected, in series with a resistor 22, between the terminals of a high tension direct current source 21; an electrode 24 of the oscillator tube 14 whose potential controls the operating frequency of the tube 14 is connected to the point of junction of triode 18 and resistor 22.

A source of voltage 25 connected to the cathode of the triode 18 applies a suitable negative bias to the grid of this triode to cut off the latter in the absence of any signal from amplifier 17. A condenser 19 and a gas diode 20 are connected in parallel with the anode-cathode space of triode 18. The positive terminal of the source of high tension supply 21 and the anode of triode 18 are grounded. Electrode 24 can, for example, be one of the electrodes bounding the interaction space of a crossed-fields backward-wave oscillator tube, the cathode of a backward-wave oscillator tube without transverse magnetic field, the reflector electrode of a reflex klystron, etc.

It is assumed that, in the present example, the operating frequency of the tube 14 is a direct function of the voltage applied to the control electrode 24. The arrangement operates as follows: when the circuit of the supply source 21 is open, the plates of condenser 19 are at the same potential. Upon the closing of this circuit, the current flowing through resistance 22 charges condenser 19 and the potential difference between its plates increases progressively. When this difference attains an appropriate value, tube 14 begins to oscillate at the lowest frequency of its operating band; this frequency then increases progressively as the charge on condenser 19 increases. The triode 18 is biased to cut off by the source 25, so long as the oscillation frequency of the tube 14 is sufficiently far from the resonance frequency of the cavity resonator 11, so that the latter delivers no signal. Meanwhile, the voltage on the plates of condenser 19 and the potential of electrode 24 continue to rise, and the oscillation frequency increases. When this frequency becomes sufficiently close to the natural oscillation frequency of the cavity resonator 11 to be covered by its passband, the resonator begins to transmit an alternating signal whose amplitude increases as the output frequency of the tube 14 becomes nearer to the natural frequency of the resonator 11. This signal is detected by crystal 16, and amplified by direct current amplifier 17; a potential appears on the grid of the triode 18 making it less negative. The triode 18 begins to pass current if bias source 25 is suitably adjusted. Its internal resistance diminishes substantially as the signal on the grid increases, and thus a time is reached when electrode 24 attains an equilibrium potential. This may be readily seen in the following way: if this potential continued to increase, the operating frequency of the tube 14 would become progressively nearer to the natural frequency of the resonator 11 and, accordingly, the signal supplied by the latter, consequently the grid signal, and the current through the triode 18 would increase; the internal resistance of the latter would decrease and this would lower the potential of control electrode 24, and, in consequence, would stabilize it. If, on the contrary, the potential of electrode 24 were to decrease, the oscillation frequency of the tube 14 would depart from the natural resonance frequency of the resonator 11; the signal produced by the latter, and therefore, the grid signal and the current through the triode 18 would rapidly decrease, the resistance of the latter and, consequently, the potential of electrode 24 would tend to increase and resume the value corresponding to equilibrium. Such equilibrium is therefore stable. If, by means of screw 12, the natural frequency of the resonator 11 is mechanically varied, the operating frequency of oscillator tube 14 will evidently also be varied.

In the case of an oscillator characterized by a decrease of frequency with the voltage applied between two of its electrodes, the tuning frequency of the resonator will be slightly higher than the desired operating frequency.

Experience has shown that the frequency of the oscillator tube is, in the circuit according to the invention, locked at a value very close to that natural frequency of the resonator; the frequency difference depends mainly on the Q factor of the resonator and has a value of the same order as the resonator natural frequency divided by this Q factor. In practice, this difference is less than one part in ten thousands.

Condenser 19 has a capacitance such that the oscillator tube 14 has reached its operating frequency before the condenser 19 is charged to its operating potential. If, for some fortuitous cause, such, for example, as a lowering of output power of the tube 14, the potential of electrode 24 were to rise excessively, the oscillation frequency of the oscillator tube 14 may, at the instant when the above cause has disappeared, have exceeded the resonance frequency of the resonator 11 so that the resonator will no more be capable of passing any signal. In these conditions, the triode 18 remains non-conductive, condenser 19 charges to its operating potential and a stable equilibrium is established, the resistance 22 and the internal resistance of the oscillator tube 14 acting as a voltage divider. However, the operating frequency does not correspond to the desired value. When this condition occurs, it is necessary to open and to close the circuit for first discontinuing and then re-establishing the voltage supply, so that regulation may be resumed and a state of equilibrium corresponding to the desired conditions may again become possible.

With this end in view, the invention provides a gas diode 20 in parallel with the triode 18; this diode 20 causes the terminals of source 21 to be short-circuited when a critical voltage is reached; this gas diode 20 fires before the afore-mentioned spurious state of equilibrium is reached and discharges the condenser 19. The cycle is then resumed until the oscillator tube 14 oscillates on a frequency slightly below the natural frequency of the resonator 11. So long as operating conditions are normal, the gas diode 20 is ineffective.

In general, it is useful to provide the direct current amplifier 17 with a bottom clipper with constant threshold amplitude.

The advantage of this improvement will be clearly seen by examining the curves of Fig. 5. On this figure, curve 1 is the resonance curve of resonator 11. Curve 2 shows the amplitude of the output signal of the amplifier 17 as a function of the frequency for an input signal of constant amplitude. These two curves have the same base and the respective ordinates of the curve 1 are equal to the respective ordinates of the points of the curve 2 having respectively the same abscissae times the gain factor of the amplifier 17. The clipper acts as a bottom clipper for the curve 2. It allows only the portion *a' m' b'* of curve 2 to control the operation of the system. The frequency band *a' b'* is less than *a b*. Moreover, the portion *a' m'* of the curve 2 is steeper than portion *a m* of the curve 1. The operating frequency of the oscillator 14 will therefore be determined with greater accuracy.

Several amplifier stages 17 combined with clippers may be provided in series.

Figure 2:
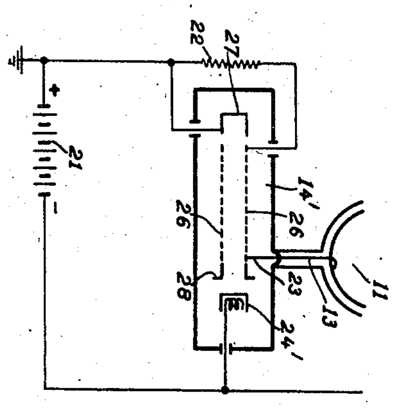
Fig. 2 shows a simplified circuit for the application of the invention to a backward-wave oscillator tube.
Figure 3:
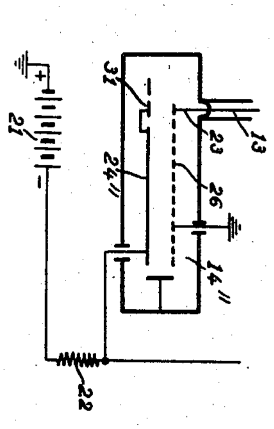
Fig. 3 is a simplified diagram for the application of the invention to another type of backward-wave oscillator tube.

Figures 2, 3 and 4 show examples of various types of oscillator tubes 14 which can be controlled in accordance with the invention.

Fig. 2 shows diagrammatically a backward-wave oscillator tube 14' of the type having no transverse magnetic field, in accordance with applicant's patent application Serial No. 281,347, filed April 9, 1952. It should be noted that in this type of backward wave oscillators the output frequency is adjusted by adjustment of the potential of the cathode.

The delay line 26 of this tube is connected to the positive terminal of the source 21, which is grounded, through the resistor 22, while the collector 27 of the tube 14' is directly connected to the same positive terminal. The negative terminal of the source 21 is connected to the cathode 24' of the tube 14'. The accelerating anode 28 is at the same potential as the delay line 26. For the remainder the arrangement is the same as in the case of Fig. 1.

It should also be noted that the delay line-cathode circuit is in fact shunting the tube 18. Accordingly the higher the current flowing in this circuit, the higher the current which it will be necessary to cause to flow through the tube 18. Therefore, it is desirable, in order to improve the efficiency of the arrangement, to reduce the cathode-delay line current.

It will be seen that this aim is achieved in the arrangement of Fig. 2, since, as the collector is at a potential which is higher than the potential of the delay line, the cathode-delay line current is reduced.

Fig. 3 diagrammatically shows a backward-wave oscillator tube 14'' with transverse magnetic field, the same numerals designating the same parts as in Figs. 1 and 2. A negative electrode 24'' is connected to the negative terminal of voltage source 21 through resistance 22. An emissive cathode 31 is connected, for example, to negative electrode 24''; delay line 26 is grounded. High frequency energy is extracted from element 23 of delay line 26 facing emissive cathode 31.

Fig. 4 shows the simplified circuit for a reflex klystron 14'''. Electrode 24''' is the reflector, raised to a slightly negative potential with respect to cathode 33, but highly negative with respect to resonator 34 from which high frequency energy is extracted from the klystron 14''' through output terminal 23. A positive voltage is therefore applied by the direct current voltage source 21 between the cathode 33 and resonator 34. Reflector 24''' is connected to the cathode of triode 18 whose anode is brought to the same potential as that of the klystron cathode 33. The circuit connecting high frequency output 23 to the grid of triode 18 is the same as previously described.

Obviously, the invention is in no way limited to the described embodiments.

In the examples described above, the frequency of oscillation of the various types of electronic tubes, while being very close to the natural resonance frequency of the resonator 11, is always less than the latter. In tubes in which, on the contrary, the frequency decreases when the applied voltage increases, the desired operating frequency would be slightly higher than the resonance frequency of the resonator. It is to be fully understood that the invention also includes the application to such tubes of the circuits described. The power delivered by the regulating triode not being negligible, the arrangement conforming to the invention will be used to better advantage with high power tubes, the loss of energy in the regulation system being more acceptable in this case.

What is claimed is:

1. A device for controlling and stabilizing the operating frequency of an electronically-tunable oscillator tube having a frequency controlling electrode and an output, said device comprising: means for applying a predetermined potential to said electrode thereby causing the oscillator to oscillate on said operating frequency, said means including a direct current supply source, a voltage divider connected in series with said source and comprising an intermediate tap, a fixed resistor, and an electron tube having at least a cathode, a control grid and an anode, said tube and said resistor being series connected through said tap; means for negatively biasing said grid relatively to said cathode; means for connecting said frequency controlling electrode to said tap; a cavity resonator having an input and an output and being detuned with respect to said operating frequency; means for connecting said input of said resonator to said output of said oscillator tube; a rectifying device having an input and an output; means for connecting said output of said cavity resonator to said input of said rectifying device; means for collecting at said rectifying device output a direct current component corresponding to the rectification product of the effective carrier frequency of said oscillator, and means for applying said direct current component to said electron tube grid, thereby controlling said frequency controlling electrode potential to stabilize it at said predetermined potential value and to adjust said effective frequency to said operating frequency.

2. A device as claimed in claim 1 further comprising a capacitor connected between said anode and said cathode of said electron tube.

3. A device as claimed in claim 2, further comprising a voltage limiter connected in parallel with said capacitor.

4. A device as claimed in claim 1, further comprising a direct current amplifier having an input connected to said rectifying device output and an output connected to said electron tube control grid.

5. A device as claimed in claim 1, further comprising means for mechanically tuning said cavity resonator thereby providing additional independent means for regulating said operating frequency.

6. A device as claimed in claim 1, wherein said oscillator is a backward wave oscillator having an anode connected to said electron tube anode, while said frequency controlling electrode is connected to said electron tube cathode.

7. A device as claimed in claim 1, wherein said oscillator is a reflex klystron comprising a cathode connected to said electron tube anode, while said frequency controlling electrode is connected to said electron tube cathode.

References Cited in the file of this patent

UNITED STATES PATENTS

| | | |
|---|---|---|
| 2,462,294 | Thompson | Feb. 22, 1949 |
| 2,475,074 | Bradley et al. | July 5, 1949 |
| 2,502,456 | Hansen et al. | Apr. 4, 1950 |
| 2,565,842 | Denis | Aug. 28, 1951 |
| 2,593,463 | Kinzer | Apr. 22, 1952 |
| 2,627,024 | Bell | Jan. 27, 1953 |
| 2,653,270 | Kompfner | Sept. 22, 1953 |

OTHER REFERENCES

Electronics, October 1953, pp. 135–137, "Backward-Wave Tube," Heffner.